United States Patent [19]

Shiragasawa et al.

[11] Patent Number: 4,761,607
[45] Date of Patent: Aug. 2, 1988

[54] APPARATUS AND METHOD FOR INSPECTING SEMICONDUCTOR DEVICES

[75] Inventors: Tsuyoshi Shiragasawa, Neyagawa; Masahide Sugano, Hirakata; Masaharu Noyori, Neyagawa, all of Japan

[73] Assignee: Matsushita Electric Industrial Co., Ltd., Osaka, Japan

[21] Appl. No.: 97,358

[22] Filed: Sep. 8, 1987

Related U.S. Application Data

[63] Continuation-in-part of Ser. No. 876,202, Jun. 19, 1986, abandoned.

[30] Foreign Application Priority Data

Jun. 27, 1985 [JP] Japan .................................. 60-140801

[51] Int. Cl.⁴ .......................................... G01R 31/28
[52] U.S. Cl. ................................. 324/158 R; 324/73 R; 371/20; 371/25
[58] Field of Search ............ 324/158 R, 73 R, 73 PC; 371/16, 20, 25

[56] References Cited

U.S. PATENT DOCUMENTS

| | | | |
|---|---|---|---|
| 4,168,796 | -9/1979 | Fulks et al. | 371/20 |
| 4,169,244 | 9/1979 | Plows | 324/73 PC |
| 4,335,457 | 6/1982 | Early | 324/73 R |
| 4,588,950 | 5/1986 | Henley | 324/158 R |

Primary Examiner—Ernest F. Karlsen
Attorney, Agent, or Firm—Wenderoth, Lind & Ponack

[57] ABSTRACT

A semiconductor device inspecting apparatus includes a signal input for an LSI device, a comparator used to compare an LSI device output with an expected value, an X-Y stage for moving the LSI device in an X direction or a Y direction, a probe for non-contact probing of the electrical state inside the LSI device, and a device for determining the probing position and for judging and executing the result, by which the defect location of the LSI device is automatically located. A corresponding semiconductor device inspecting method includes a step of applying a test pattern to an input terminal of an LSI device, a step of comparing an output signal appearing at the output terminal of the semiconductor device with an expected value signal to detect conformity or nonconformity of the output signal and the expected value signal, a step of probing, in the case of nonconformity, of a specific portion of the semiconductor device by controlling a non-contact probe by using an error signal appearing at the output terminal; and a step of comparing this probing data with an expected value of the probed portion to locate the defect location in the semiconductor device.

7 Claims, 7 Drawing Sheets

| TEST STEP | TEST INPUT | | | SIMULATION DATA | | | | | OUTPUT EXPECTED | TEST RESULT |
|---|---|---|---|---|---|---|---|---|---|---|
| | 1 | 2 | 3 | 5 | 6 | 7 | 8 | 9 | 4 | |
| t1 | 0 | 0 | 0 | 1 | 1 | 0 | 0 | 0 | 0 | ○ |
| t2 | 0 | 0 | 0 | 1 | 0 | 0 | 1 | 0 | 1 | ○ |
| t3 | 0 | 1 | 0 | 1 | 1 | 1 | 0 | 1 | 1 | ○ |
| t4 | 0 | 1 | 1 | 1 | 0 | 1 | 1 | 1 | 1 | ○ |
| t5 | 1 | 0 | 0 | 0 | 1 | 0 | 0 | 0 | 0 | ○ |
| t6 | 1 | 0 | 1 | 0 | 0 | 0 | 0 | 0 | 0 | ○ |
| t7 | 1 | 1 | 0 | 0 | 1 | 0 | 0 | 0 | 1 | × |
| t8 | 1 | 1 | 1 | 0 | 0 | 0 | 0 | 0 | 0 | ○ |

4,761,607

APPARATUS AND METHOD FOR INSPECTING SEMICONDUCTOR DEVICES

This application is a continuation-in-part of now abandoned application Ser. No. 876,202, filed June 19, 1986, now abandoned.

BACKGROUND OF THE INVENTION

This invention relates to an apparatus and method for inspection used in the analysis of defects in semiconductor devices, and more particularly to an apparatus and method for inspecting semiconductor devices capable of effectively detecting defects in an LSI of smaller size, higher density, and higher integration.

As LSI devices become higher and higher in integration, it becomes difficult to find the location of defects by an electrical analysis alone by using an LSI tester. Accordingly, it is necessary to measure and directly observe the electrical state of the internal circuit of an LSI device.

Conventionally, for this purpose, a mechanical probe was directly fitted to the Al wiring pattern inside the LSI device, and the electrical state was measured to discover a defect location. In this method, however, as the LSI became smaller and smaller, it has become difficult to place the mechanical probe correctly on the Al wiring inside the LSI device, and it can no longer be applied to today's high integration LSI analysis. Besides, the distributed capacitance in the mechanical probe or wiring may deteriorate the precision of measurement.

Recently, to solve the above-discussed problems, research and development are being concentrated, for example, into electron beam probes by applying an scanning electron microscope (S.E.M.) as disclosed in pages 172–201 of Nikkei Electronics 3-15, 1985, and this technology is applied in the analysis of an LSI device. This device is intended to observe, without making contact, the electrical state inside the LSI device, by aiming electron beams at the surface of an LSI device placed in a vacuum, and detecting the secondary electron signal released from the LSI device surface, and it can be advantageously applied to micro-sized LSI device.

On the other hand, an attempt has been made to develop a laser probe to analyze the internal state of an LSI device by reducing the laser beam into a small focus and aiming it at the LSI device. This method is used to analyze, without contact, the logic state inside of the LSI device in the atmosphere, instead of in a vacuum.

With these two contactless probing means, however, it is extremely difficult to pinpoint the defect location in a large LSI device.

When analyzing a defect in an LSI device by using the contactless probing technology, it is necessary to probe from the external terminal where an LSI device fault trouble has been detected sequentially toward the inside of the LSI device, and judge if the result of probing is correct or not. In this case, in today's LSI device, since its circuit scale is enormous, it is next to impossible to probe all of the tremendous member of nodes and judge each result. It is therefore considered effective to probe and judge only the node (a specific portion of the internal circuit) considered to be related to the LSI defect. However, it is not efficient to determine which node should be probed depending on the symptom of the LSI defect and judge the result every time using manual labor. Besides, only those having sufficient knowledge of the LSI circuit composition and pattern configuration are qualified to select the node to be probed and judge the result of the probing.

SUMMARY OF THE INVENTION

The present invention, therefore, has as its principal object the provision of a means by which failure analysis of a highly integrated LSI device can be conducted effectively.

Another object of the invention is to provide an improved semiconductor inspection apparatus which tells a user the information regarding which portion or node of a semiconductor device is defective.

A further object of the invention is to provide an improved semiconductor inspection method by which failure the defective portion of a semiconductor device can be detected.

These and other objects are accomplished according to the present invention, by a semiconductor device inspecting apparatus which comprises a test signal input means for a semiconductor device, a comparing means for comparing the output of the semiconductor device with an expected value, an X-Y stage for moving the semiconductor device in an X direction and a Y direction, a probing means for probing without making contact, the electrical state inside the semiconductor device, and a means for determining the probing position, and for judging and executing the result, or by a semiconductor device inspecting method characterized by a step of applying a test signal to the input terminal of a semiconductor device, a step of comparing the output signal appearing at the output terminal of said semiconductor device with an expected value signal to detect conformity or nonconformity of the output signal and expected value, a step of controlling, in the case of nonconformity, the contactless probing means by using an error signal appearing at said output terminal to probe a specified portion of said semiconductor device, and a step of detecting the defective portion of said semiconductor device by comparing this probing data and the expected value of said probed portion.

According to the present invention as described herein, the following benefits, among others, are obtained.

(1) The defective portion of a semiconductor device may be automatically specified, for example, by node number.

(2) By employing the contactless probing technology, a smaller area can be analyzed, and it is possible to effectively probe the node relating to the failure of an LSI device out of a tremendous number of nodes in a highly integrated LSI device and to automatically judge the probing result with respect to numerous test input signals.

BRIEF DESCRIPTION OF THE DRAWINGS

While the novel features of the invention are set forth with particularity in the appended claims, the invention, both as to organization and content, will be better understood and appreciated, along with other objects and features thereof, from the following destailed description taken in conjunction with the drawings in which:

DETAILED DESCRIPTION OF THE INVENTION

Figure 1:
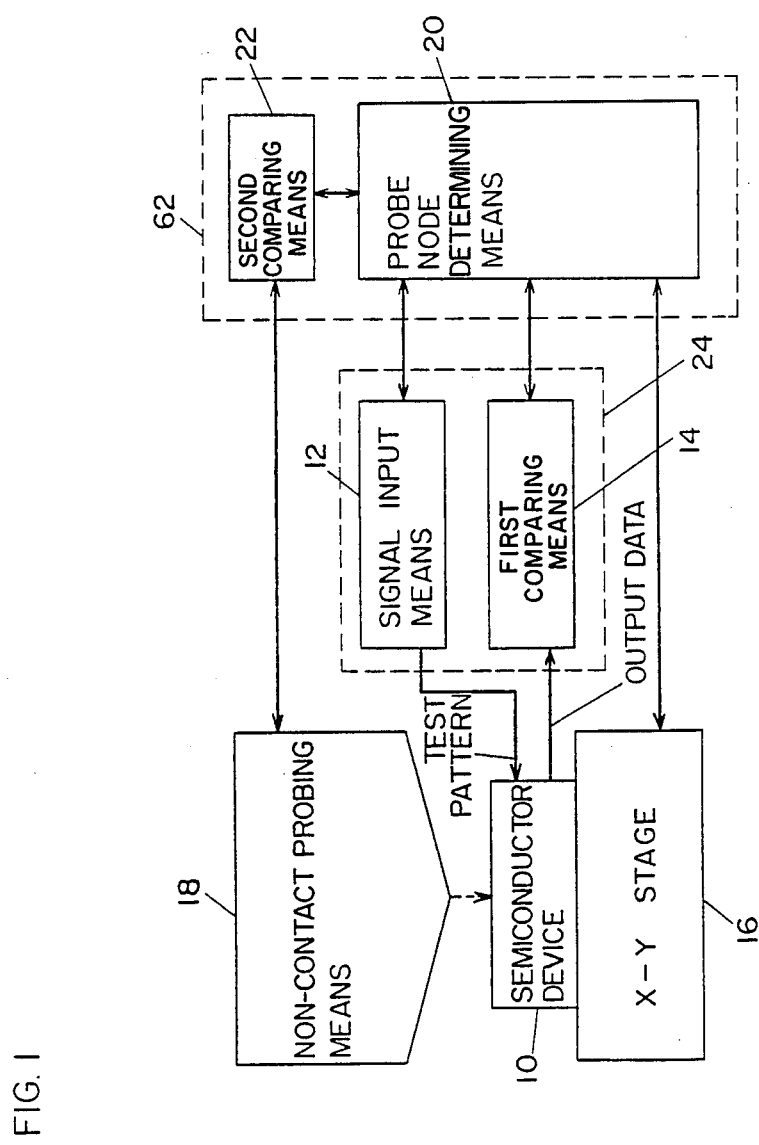
FIG. 1 is a schematic block diagram of a semiconductor device inspecting apparatus in one of the embodiments of this invention.
Figure 2:
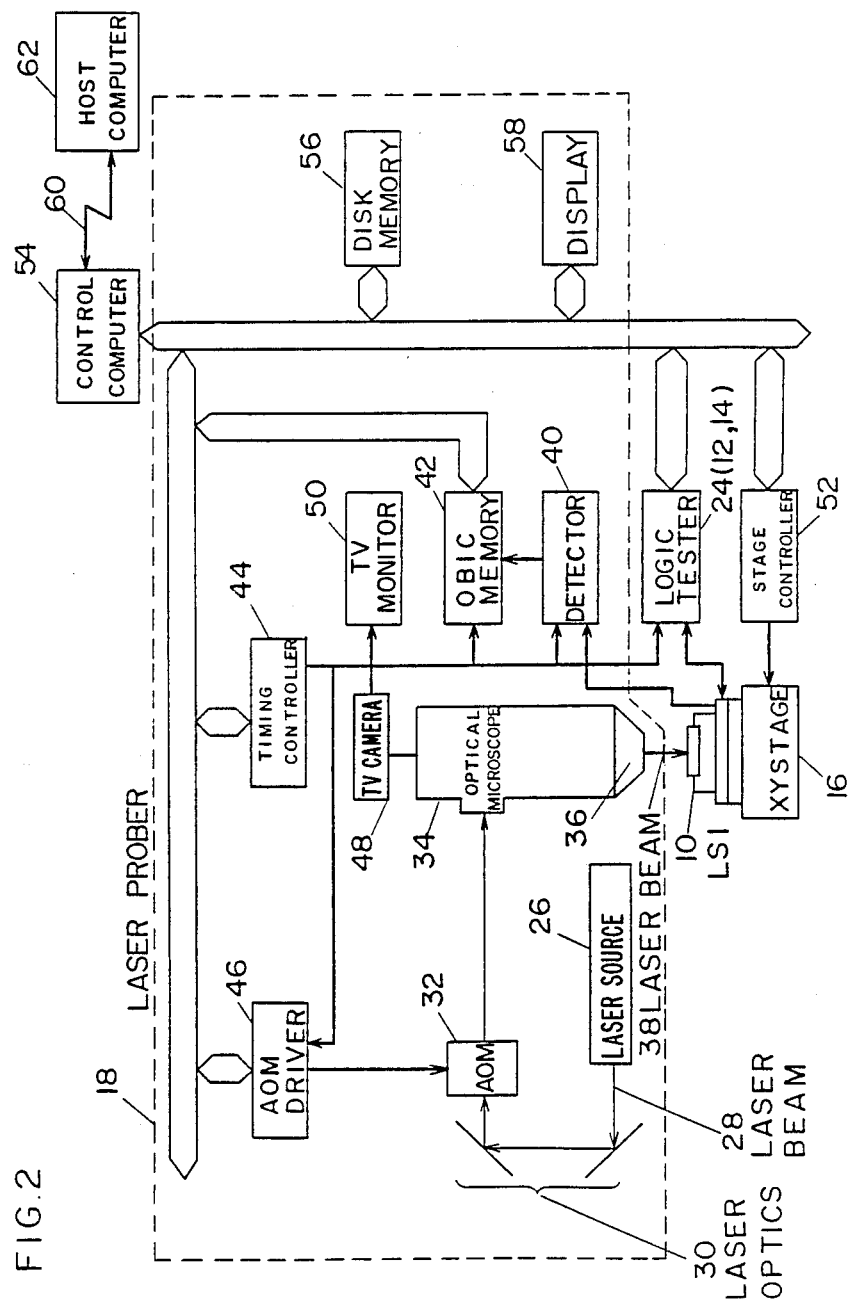
FIG. 2 is a detailed block diagram of a semiconductor device inspecting apparatus in one of the embodiments of this invention.

An embodiment of semiconductor device inspecting apparatus according to this invention is described while referring to FIGS. 1 and 2.

FIG. 1 is a block diagram showing the construction of the inspecting apparatus in one of the embodiments of this invention. To a semiconductor device (e.g. LSI) 10, a test pattern signal is applied from signal input means 12, and the output data from the semiconductor device 10 at this time is compared with an expected value (normal output signal) of the semiconductor device 10 preliminarily stored in a first comparing means 14 by means of this first comparing means 14. The semiconductor device 10 is placed on an X-Y stage 16, and is allowed to move in an X or a Y direction. When the first comparing means 14 judges that the output data of the semiconductor device 10 does not coincide with the expected value, it means that the semiconductor device 10 is defective. When this defect is detected, the state of said test input signal at that moment, the output terminal number of the semiconductor device in which the defect has been detected, and other information are stored in the first comparing means 14. Now, in order to pinpoint the defect location in the semiconductor device 10, the semiconductor device inspecting apparatus of this embodiment has a non-contact probing means 18 which detects the electrical state of the internal circuit of the semiconductor device 10 without contacting it. Where to probe in the internal circuit of semiconductor device 10 differs depending on the symptom of the defect of the semiconductor device 10. Accordingly, the semiconductor device inspecting apparatus of this embodiment has a probe node determining means 20 to automatically determine where to probe in the inside of the semiconductor device 10 depending on the symptom of the defect of the semiconductor device 10, and the position selected by this means is probed by the probing means, and this probing result is automatically compared with an expected value (the normal operation value of the portion being probed) by a second comparing means 22.

Furthermore, a practical construction of this embodiment is illustrated in conjunction with FIG. 2.

In FIG. 2, to the LSI (semiconductor device) 10 to be analyzed, a supply voltage is applied together with a test pattern signal from a logic tester 24, and the output signal delivered from the output terminal of the LSI 10 is compared with an expected value stored in the logic tester 24 by means of this logic tester 24, and the result of comparison is stored in the logic tester 24. In this way, the logic tester 24 is responsible for both applying the necessary voltage and test pattern, and for judging the output signal and expected signal. That is, the logic tester 24 comprises the functions of both the signal input means 12 and the first comparing means 14 shown in FIG. 1. When nonconformity is detected as a result of this comparison, the defective LSI device is inspected so as to locate the position of the defect by the next probing step.

In this embodiment, as the noncontact probing means 18 for analyzing the operating state of the internal circuit of the LSI device, a laser prober is used. A laser beam 28 emitted from a laser source 26 (in this embodiment, a He-Ne laser: $\lambda = 6328$ Å) enters an optical microscope 34 by way of laser optics 30 and an A.O.M. (acousto-optic modulator) 32 responsible for power control and pulse control. The laser beam entering the optical microscope 34 is reduced by an objective lens 36 to become a fine laser beam 38, used to irradiate the surface of the LSI 10. At this time, meanwhile, the cap of the package of the LSI 10 must be removed to expose the surface of the semiconductor chip.

Here, the principle of laser probing method is as follows: by irradiating a laser beam into, for example, the drain region of a MOSFET within the LSI, the optical beam induced current (OBIC) appearing at the power line terminal of the LSI is measured, so that the electrical state (on/off state) of the MOSFET during laser irradiation may be analyzed.

That is, when the laser beam is radiated, inside the LSI 10, pairs of electron-pole are excited by the laser beam irradiation, and the OBIC corresponding to the electrical state of the node of the circuit irradiated by the laser beam flows into the power line terminal or GND terminal of the LSI 10. This OBIC is measured by an OBIC detector 40, and the result of the measurement is stored in the OBIC memory 42 successively.

Since it is necessary that the timing of the logic tester 24, A.O.M. 32, OBIC detector 40, and OBIC memory 42 must be synchronized, they are controlled by means of a timing controller 44. This A.O.M. 32 operates as the timing is controlled through an A.O.M. driver 46.

In this embodiment, it is possible to observe what part of the LSI 10 is irradiated by the laser beam 38 by means of a television camera 48 and television monitor 50.

The LSI 10 is placed on the X-Y stage 16. By moving the X-Y stage 16 with a stage controller 52, the laser beam 38 can be irradiated upon a desired position on the surface of the LSI 10. Meanwhile, the X-Y stage 16 has an adjusting mechanism of a rotary shaft in the Z-axis direction, aside from the X-Y direction, so that a focal adjustment of the laser spot on the LSI 10 surface and a parallelism adjustment of the LSI 10 is possible.

A control computer 54 controls, by means of a program, said logic tester 24, OBIC memory 42, timing controller 44, A.O.M. driver 46 and stage controller 52, and also analyzes the data stored in the OBIC memory 42. The measurement data and the result of an analysis can be stored, if necessary, in a magnetic disk memory 56. Or, when necessary, the stored measurement data and analysis result may be read out and processed as required, and displayed by a display unit 58. In this construction, it is possible to probe the operating condition of the internal circuit of an LSI without making contact. This control computer 54 is connected to a host computer 62 by way of a signal line 60 so as to refer to the design data base of the LSI mentioned below and to determine where to probe in the internal circuit of the LSI.

Figure 3:
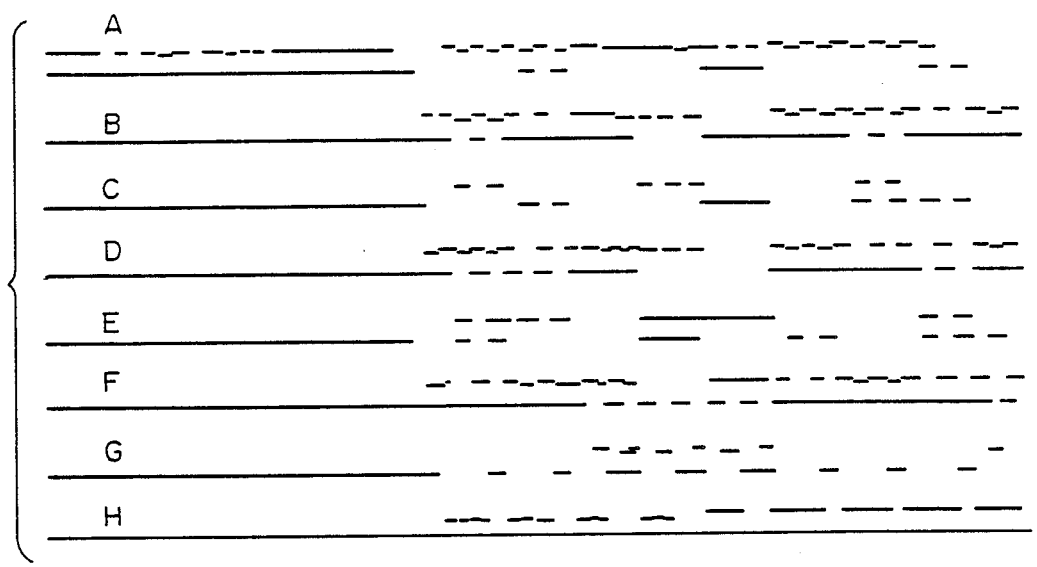
FIG. 3 is a diagram showing the result of the measurement of an optical excitation current.
Figure 4:
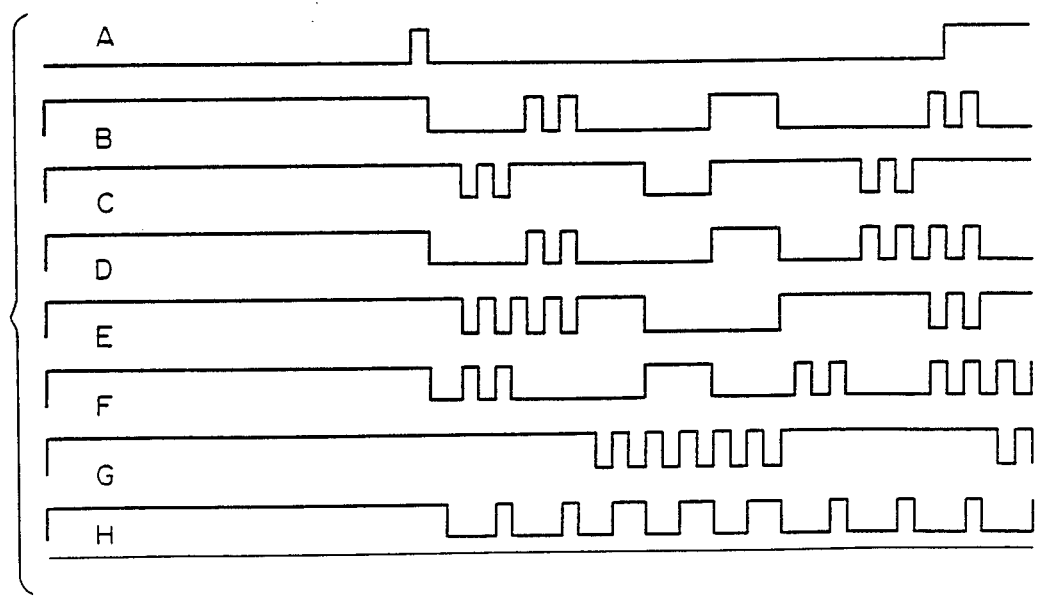
FIG. 4 is a theoretical representation of the optical excitation current by binary-coding.

An example of operation analysis of the inside of LSI by using the semiconductor device inspecting apparatus in this construction is explained by referring to FIG. 3. FIG. 3 shows the result of measurement of the OBIC by laser probing of eight nodes (A through H) of the gate circuit 66 connected to one of internal circuits, for example, control circuit 64 of the LSI 10 shown in FIG. 5. At this time, the above-mentioned test pattern signal is applied to the input terminal of the LSI 10. As understood from FIG. 3, along with the progress of the steps of the test pattern signal, the OBIC value changes as nodes A to H are being probed by the laser beam. The LSI 10 is a logic LSI, and the operation of the internal circuit corresponds to 1 and 0, and the measured OBIC corresponds to 1 and 0. FIG. 4 shows the binary logic representation of the OBIC shown in FIG. 3.

The outline of the semiconductor device inspecting method is explained below together with the description of probing node determining means relating to the semiconductor device inspecting apparatus.

Figure 5:
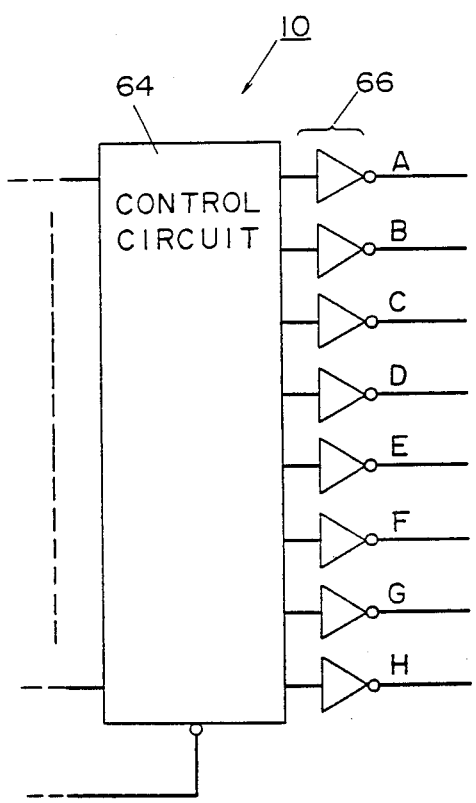
FIG. 5 shows part of an internal circuit of an LSI device.
Figure 6:
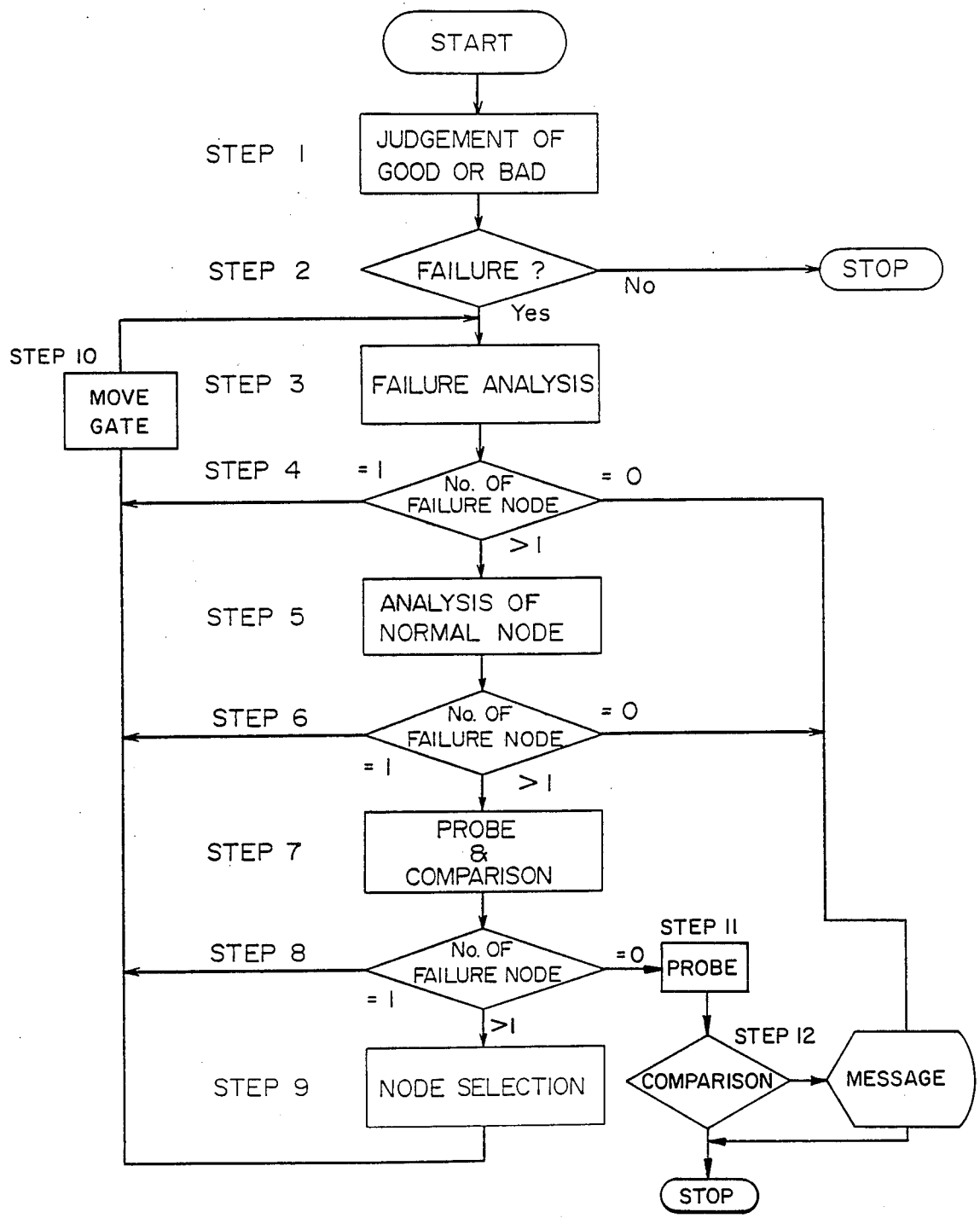
FIG. 6 is a flowchart showing the flow of the semiconductor device inspecting method in one of the embodiments of this invention.

FIG. 6 shows the flow of an embodiment of the semiconductor device inspecting method. First, at step 1 and step 2, a test pattern is fed into the LSI 10 through the signal input means 12, and the LSI 10 is judged to be good or bad by the first comparing means 14. As a result of the judgement, if the LSI 10 is found to be good, failure analysis is not needed, and processing is over. If, however, the LSI 10 is found to be bad, at step 3, the output terminal of LSI 10 where a failure has been detected is analyzed as to its failure state, such as "0" error or "1"-error, and at this step the condition for delivering failure to the output terminal, that is, the number of nodes and node No. having the possibility of error or error propagation selected from among the input nodes will be extracted by use of the type of gate, the number of nodes, from among an LSI design data base and logic-simulation result based upon test data assuming that a gate circuit having the output terminal as output node is set as a gate circuit to be inspected. Then, at step 4, if the number of input nodes having the possibility of error or error propagation is only one, step 3 is executed again under the condition that the gate circuit having this one node as its ouput is set as the object of analysis and a gate to be inspected becomes one preceding gate at step 10. If there are plural input nodes having the possibility of error or error propagation, a determination is made as to whether or not normal nodes are contained in said plural inputs having the possibility of error or error propagation by analyzing the test history at step 5, and the number of input nodes having the possibility of error or error propagation is explored. This result is judged at step 6, and if the number of input nodes having the possibility of error or error propagation is found to be one, step 3 is executed once more under the condition that the gate circuit having this one node as an output is used as the gate to be inspected. Or, as a result of the judgement at step 3, if the number of input nodes having the possibility of error or error propagation is plural, these nodes are probed at step 7 by means of said noncontact probing means 18 (in this embodiment, a laser prober). At this time, the intended nodes are irradiated by the laser beam 38. In this apparatus, by moving the X-Y stage 16, the laser beam 38 irradiates the object nodes, and the results are obtained as shown in FIGS. 3, 4, and 5. The results of probing plural nodes are judged at step 8, and when the actual number of nodes with an error or error propagation is found to be one, at step 10 step 3 is executed again on the gate having this one node as an output as the gate to be inspected. When the actual number of nodes with an error or error propagation is found to plural as a result of probing, step 3 is executed on the gate having these nodes as an output as the gate to be inspected. When it is judged that all the input nodes are normal as a result of probing, the output of the gate to be inspected in probed at step 11. The result of the probing is judged at step 12. As a result of the judgement, when the output of the gate includes an error, the error portion is found as the failure of the gate itself on as an input failure of the gate which receives the output of the gate as its input. Incidentally, when it is judged that there are no failure at steps 4, 6 and 12, a message is outputted at step 12 and the processing is over.

Figure 7:
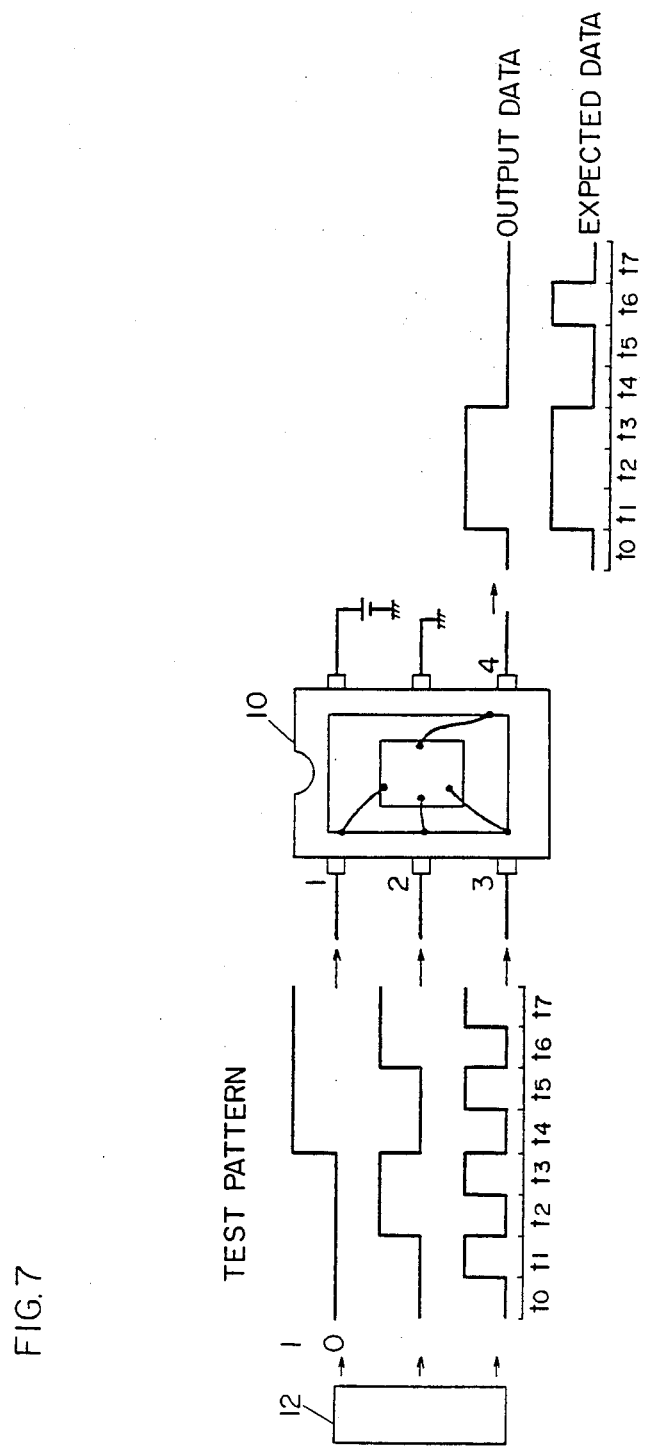
FIG. 7 is a diagram to showing the judging method.
Figures 8, 9:
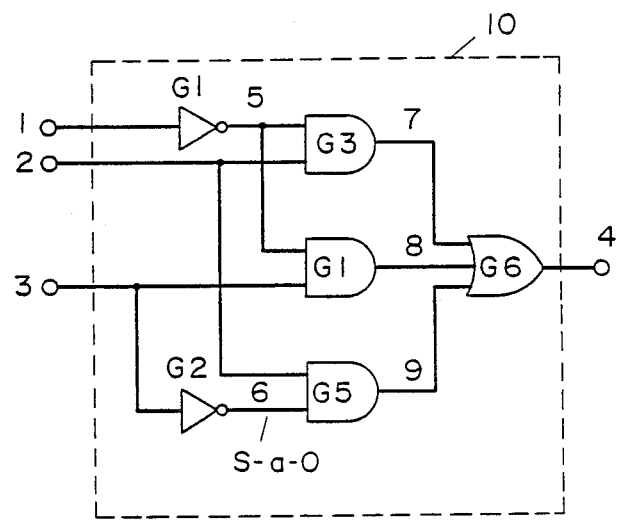
FIG. 8 is a diagram to showing an example of a defective circuit.
FIG. 9 is a diagram showing the data used in failure estimation and probing.

Practical examples of actually analyzing the failure of an LSI device by employing such an apparatus and method for inspecting semiconductor devices are explained by referring to FIGS. 7, 8, and 9.

In FIG. 7, a test pattern is applied to input terminals 1, 2, 3 of an LSI 10 from a signal input means 12, and an output signal corresponding to said test pattern is delivered from an output terminal 4. This output signal is compared with an expected value (an output signal during normal operation) of the LSI 10, and the LSI 10 is judged to be good or bad. If the LSI 10 is judged to be bad, the operation proceeds as follows.

Generally, LSIs are often designed by CAD (computer used aided design), and the computer for CAD stores the LSI circuit connection data (net data), the LSI mask layout data, the logic simulation result by a logic simulator, and other LSI design data. In this embodiment, accordingly, by using the test input data used in the analysis, the LSI test result (good/bad judgement), said circuit connection data of LSI, and the LSI logic simulation result for the test input data, the inspection progresses from the output terminal of LSI where a failure has been detected by said judgement of good or bad toward the inside of the LSI device to estimate which node in the internal circuit of the LSI device has the possibility of error or error propagation, and when this estimation becomes difficult, actual probing is urged to the operator, and the node No. (or node name) inside the LSI device to be probed is noticed at the same time.

FIG. 8 shows the construction of part of the internal circuit of LSI 10 shown in FIG. 7, and FIG. 9 depicts the test input used in the analysis, the logic simulation data, and the test result.

For example, the case of node 6 of LSI 10 shown 35 in FIG. 8 being S-a-0 (stuck at zero type fault) is explained. When tested by the test input shown in FIG. 9, at test step $t_1$, a "0" error signal is delivered at output terminal No. 4 (that is, the signal that should be originally a "1" has been detected as a "0"), and it is judged as a defective circuit. The process of estimating the location of fault in the LSI internal circuit from that point is shown below, together with the method of requesting probing. The step No. used in the following explanation corresponds to the step No. shown in FIG. 6.

Step 2: detected as a "0" error failure of output terminal 4 at $t_7$;

Step 3: analyzing the conditions of input nodes 7, 8, 9 when a "0" eror signal is outputted from $G_6$ at $t_7$; $G_6$ is an OR circuit and the respective expected values of input nodes 7, 8, and 9 of $G_6$ at $t_7$ are "0", "0", and "1". There are several cases where a "0" error signal is outputted from $G_6$: i.e., (i) the output node of $G_6$ is S-a-0; (ii) the "0" error signal is transferred to input node 9; or (iii) the output node 9 is S-a-0.

Step 4: As a result of the analysis at step 3, it is found that a "0" error signal appears only at input node 9. Since the number of input nodes having the possibility of error or error propagation is one, step 3 is executed again. Input node 9 of $G_6$ is an output node of $G_5$, and $G_5$ is an AND gate. Further, expected values of input nodes 2 and 6 of $G_5$ at step 7 are "1" and "1", respectively. There are several cases wherein a "0" error signal is outputted from $G_5$, i.e., (i) the output node of $G_5$ is S-a-0, (ii) a "0" error signal is transferred to input node 2 or 6, or both of them; or (iii) the output node 2 or 6, or both of them is S-a-0.

Step 10: A gate to inspected becomes the proceeding gate, i.e., $G_5$.

Step 4: As a result of the above analysis, it is found that there is a possibility that a "0" error signal appears at the two input nodes 2 and 6 with regard to the input nodes of $G_5$. In such a situation, there is a possibility that an error signal appears at a plurality of input nodes, and step 5 is executed.

Step 5: Based on a past test ($t_1 \sim t_6$), an analysis is made as to whether an S-a-0 of input nodes 2 and 6 of $G_5$ is negated.

As one of the conditions for negating an S-a-0 of input node 2 in this embodiment, it is pointed out that:

"nodes 8 and P are "0" and node 7 is "1", and the output terminal 4 is free from a "0" error. However, at $t_1 \sim t_6$, nodes 8 and 9 become "0" simultaneously and there is no condition that node 7 becomes "1". As another condition for negating an S-a-0 at input node 2, it is pointed out that nodes 7 and 8 are "0" and node 9 is a "1", and a "0" error signal does not appear at output terminal 4. As still another condition for negating an S-a-0 of input node 2, it is pointed out that nodes 7 and 9 are a "1", and node 8 is a "0", and a "0" error signal does not appear at output terminal 4. The above test condition exists at test step 3. Therefore, an S-a-0 at node 2 is negated. Then, the condition for negating an S-a-0 at node 6 is that nodes 7 and 8 are "0", and node 9 is a "1", and a "0" error signal does not appear at output terminal 4. Like the above, this test does not exist at test step $1 \sim 6$.

Step 6: As a result of the analysis at step 5, an S-a-0 at node 2 is negated, and therefore, an error signal appears only at node 6. Then, a gate to be inspected becomes the one preceding gate and step 3 is again executed.

Step 3: At $t_7$, an analysis is made on a condition that node 6 becomes a "0" error, wherein node 6 is an output of $G_2$. There are cases wherein a "0" error signal is outputted from node 6; i.e., (i) the output of $G_2$ or the input of $G_5$ is an S-a-0; or (ii) a "1" error signal appears at the input node 0 of $G_2$.

Step 4: The input of $G_2$ is only node 3. Steps 10 and 13 are executed again.

Step 3: Node 13 is an input node. It is impossible to conduct back-tracing further. Therefore, it is necessary to actually probe node 3, and step 7 is executed.

Step 7: As a result of actual probing, it is found that node 3 operates normally. Therefore, there is a possibility that the output of $G_2$ is a "0" error, and node 6 is actually probed. As a result of probing, it is found that node 6 is a "0" error.

Incidentally, an S-a-0 of node 2 cannot be negated at step 5, assuming the case that test step $t_3$ is not executed before $t_7$ in FIG. 9, although test inputs shown in FIG. 9 do not produce problems. Therefore, in this case, at step 6, the node having the possibility of failure becomes plural, and there is a possibility that a "0" error signal appears at both nodes 2 and 6, and it is necessary to actually probe both nodes 2 and 6.

In the above process, steps 2 to 6 and 10 are the estimating process of the error or error propagation node, while steps 7 and 11 are intended to provide notification of the request of probing to the operator and the node No. in which probing is requested. Meanwhile, the reason for requesting the actual probing at step 7 is because the estimating process is complicated if there are plural nodes with the possibility of error or error propagation. The gate No., gate name, node No. etc. to be probed are displayed on display apparatus of this inspecting apparatus. At this time, an operator operates the apparatus to control the XY stage on which a semiconductor device is mounted, and to move and locate then ode to be probed by the laser beam point of laser prober 30 and to execute the probing. Steps 8 and 12 are processes for judging the probing result.

In this invention, the steps noted above, except for steps 7 and 11, are compiled in software, and the node to be probed is automatically determined, so that the operator can probe the requested node according to the probing request from this software. Explained below is the software used to judge whether or not the probing result is correct.

In this embodiment, the result of probing the LSI device internal circuit is judged by comparing it with said logic simulation data. Therefore, since the logic simulation data used in the above estimation process can be applied, it is possible to compare and judge easily.

All of such software and necessary data are present in the host computer 62 shown in FIG. 2, and data is exchanged with the probing system through communication line 60 in FIG. 2.

In this embodiment, a laser prober is used as the non-contact probing means, but it may be also replaced by an electron beam prober. It is possible to analyze faults more effectively by calculating the X-Y coordinates of the node to be probed by using the mask layout data of the LSI design data, and probing the intended node by controlling the X-Y stage automatically.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim is:

1. A semiconductor device inspecting apparatus comprising:
   a signal input means for supplying test pattern to a semiconductor device to be inspected;
   a first comparing means for comparing an output signal delivered from said semiconductor device with a prestored expected value which is dependent upon the application of this test pattern;
   a non-contact probing means for probing, without making contact, an electrical state inside said semiconductor device;

a position adjusting means for adjusting the relative configuration of said semiconductor device and said non-contact probing means;

a second comparing means for comparing probing data from said non-contact probing means with said expected value; and a determining means for determining which node is probed using the comparison result of said first or second comparison means and circuit connection information of said semiconductor device and test pattern data and logic simulation data according to said test pattern data.

2. A semiconductor device inspecting apparatus of claim 1, wherein said non-contact probing means is composed of a laser prober.

3. A semiconductor device inspecting apparatus of claim 1, wherein said non-contact probing means is composed of electron beam prober.

4. A semiconductor device inspecting apparatus of claim 1, wherein said signal input means and first comparing means are composed of a logic tester.

5. A semiconductor device inspecting apparatus of claim 1, wherein said position adjusting means comprises an X-Y stage on which said semiconductor device to be inspected is mounted.

6. A semiconductor device inspecting apparatus of claim 1, wherein said probing position determining means is composed by programming into a computer.

7. A semiconductor device inspecting method comprising:

a step of supplying a test pattern to an input terminal of a semiconductor device to be inspected, and comparing an output signal appearing at an output terminal of said semiconductor device when the test pattern is supplied with an expected pattern to detect conformity or nonconformity of said output signal and expected pattern;

a step of determining which node is probed using the comparison result and circuit connection information of the semiconductor device and test pattern data and logic simulation data according to the test pattern data when said nonconformity is detected;

a step of measuring a logic state of the node to be probed by probing the node using a non-contact probing means;

a step of comparing the logic state meansured with result of logic simulation; and a step of determining which node is probed using the result of the comparison of the measured logic state and the logic simulation result, circuit connection information of the semiconductor device, test pattern data, and logic simulation data according to the test pattern data.

* * * * *